(12) United States Patent
Zhang

(10) Patent No.: US 12,042,902 B2
(45) Date of Patent: Jul. 23, 2024

(54) FORCE MEASUREMENT SYSTEM

(71) Applicant: CHANGXIN MEMORY TECHNOLOGIES, INC., Hefei (CN)

(72) Inventor: Zhengxian Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 366 days.

(21) Appl. No.: 17/455,959

(22) Filed: Nov. 22, 2021

(65) Prior Publication Data

US 2022/0176515 A1   Jun. 9, 2022

Related U.S. Application Data

(63) Continuation of application No. PCT/CN2021/103798, filed on Jun. 30, 2021.

(30) Foreign Application Priority Data

Dec. 3, 2020   (CN) .......................... 202011414407.0

(51) Int. Cl.
*B24B 49/10* (2006.01)
*B24B 1/00* (2006.01)
*G01L 1/26* (2006.01)
*G01L 5/00* (2006.01)
*H01L 21/67* (2006.01)

(52) U.S. Cl.
CPC ................ *B24B 49/10* (2013.01); *B24B 1/00* (2013.01); *G01L 1/26* (2013.01); *G01L 5/0076* (2013.01); *H01L 21/67092* (2013.01); *H01L 21/67253* (2013.01)

(58) Field of Classification Search
CPC .. B24B 49/10; B24B 1/00; G01L 1/26; G01L 5/0076; H01L 21/67092; H01L 21/67253
See application file for complete search history.

(56) References Cited

U.S. PATENT DOCUMENTS 5,054,244 A * 10/1991 Takamatsu ............ B24B 13/015
451/411
5,868,896 A    2/1999 Robinson et al.
(Continued)

FOREIGN PATENT DOCUMENTS

CN    102564649 A    7/2012
CN    102729136 A    10/2012
(Continued)

OTHER PUBLICATIONS

CN-111055213-A English Translation (Year: 2020).*
(Continued)

*Primary Examiner* — Ryan D Walsh
(74) *Attorney, Agent, or Firm* — Kilpatrick Townsend & Stockton LLP

(57) ABSTRACT

Force measurement system is provided. It includes: a grinding arm and a stressed layer, the stressed layer being configured to bear a force from the grinding arm; a base and a plurality of elastic bodies, the elastic bodies being fixed between the stressed layer and the base; a deformation sensor, configured to detect deformation of the elastic bodies; and an analysis device, configured to obtain the force on the stressed layer according to a detection result of the deformation sensor and an elastic constant of the elastic body.

20 Claims, 1 Drawing Sheet

(56) References Cited

U.S. PATENT DOCUMENTS

| | | |
|---|---|---|
| 5,944,580 A | 8/1999 | Kim et al. |
| 2009/0318062 A1 | 12/2009 | Chiu et al. |
| 2013/0052917 A1* | 2/2013 | Park .................. B24B 37/015 451/526 |
| 2023/0304877 A1* | 9/2023 | Zhang .................. H01L 21/67 |

FOREIGN PATENT DOCUMENTS

| | | | |
|---|---|---|---|
| CN | 102802871 A | | 11/2012 |
| CN | 102950522 A | | 3/2013 |
| CN | 103144040 A | | 6/2013 |
| CN | 104354093 A | | 2/2015 |
| CN | 204546249 U | | 8/2015 |
| CN | 204868480 U | | 12/2015 |
| CN | 205271690 U | | 6/2016 |
| CN | 206415468 U | | 8/2017 |
| CN | 107902519 A | | 4/2018 |
| CN | 207696339 U | | 8/2018 |
| CN | 108760098 A | * | 11/2018 |
| CN | 109202686 A | | 1/2019 |
| CN | 109794855 A | | 5/2019 |
| CN | 110024087 A | | 7/2019 |
| CN | 209774374 U | | 12/2019 |
| CN | 209868282 U | | 12/2019 |
| CN | 111055213 A | * | 4/2020 ........... B24B 37/005 |
| CN | 211728760 U | | 10/2020 |
| JP | H07290356 A | | 11/1995 |
| JP | H0938856 A | | 2/1997 |
| JP | H10118917 A | | 5/1998 |
| JP | H11333718 A | | 12/1999 |
| JP | 2002046059 A | | 2/2002 |
| KR | 20060081850 A | * | 7/2006 |

OTHER PUBLICATIONS

CN-108760098-A English Translation (Year: 2018).*
KR-20060081850-A English Translation (Year: 2006).*
International Search Report as cited in PCT Application No. PCT/CN2021/107263 mailed Sep. 18, 2021, 10 pages.
International Search Report as cited in PCT Application No. PCT/CN2021/103798 mailed Sep. 27, 2021, 4 pages.

* cited by examiner

FORCE MEASUREMENT SYSTEM

CROSS-REFERENCE TO RELATED APPLICATIONS

This application is a continuation application of International Patent Application No. PCT/CN2021/103798, filed on Jun. 30, 2021, which claims priority to Chinese Patent Application No. 202011414407.0, filed with the Chinese Patent Office on Dec. 3, 2020 and entitled "FORCE MEASUREMENT SYSTEM". International Patent Application No. PCT/CN2021/103798 and Chinese Patent Application No. 202011414407.0 are incorporated herein by reference in their entireties.

TECHNICAL FIELD

Embodiments of the present disclosure relate to the field of semiconductors, and in particular to a force measurement system.

BACKGROUND

The chemical mechanical polishing process is to conduct a grinding operation under chemical and mechanical action. During the grinding process, the grinding amount is required to be controlled. The key elements involved in this process include controlling the down force of a grinding arm. The down force will directly influence a grinding rate and the degree of particle aggregation during the grinding process. Therefore, precise control over down force is particularly important.

SUMMARY

Various embodiments of the present disclosure provide a force measurement system, which is beneficial to detecting the balance of a force applied to a stressed layer by a grinding arm.

In order to solve the above problem, an embodiment of the present application provides a force measurement system includes: the grinding arm and a stressed layer, the stressed layer being configured to bear a force from the grinding arm; a base and a plurality of elastic bodies, the elastic bodies being fixed between the stressed layer and the base; a deformation sensor, configured to detect deformation of the elastic bodies; and an analysis device, configured to measure the force on the stressed layer according to a detection result of the deformation sensor and an elastic constant of the elastic bodies.

BRIEF DESCRIPTION OF DRAWINGS

One or more embodiments are illustrated in an exemplary manner by pictures in the corresponding drawings, and unless otherwise stated, the pictures in the drawings do not constitute a scale limitation.

DESCRIPTION OF EMBODIMENTS

In order to make the objectives, technical solutions, and advantages of the embodiments of the present disclosure more clear, various embodiments of the present disclosures will be detailed below in combination with the accompanying drawings. However, a person of ordinary skill in the art can understand that in each embodiment of the present disclosure, many technical details are provided for readers to better understand the present disclosure. However, even if these technical details are not provided and based on variations and modifications of the following embodiments, the technical solutions sought for protection in the present disclosure can also be implemented.

Figure 1:
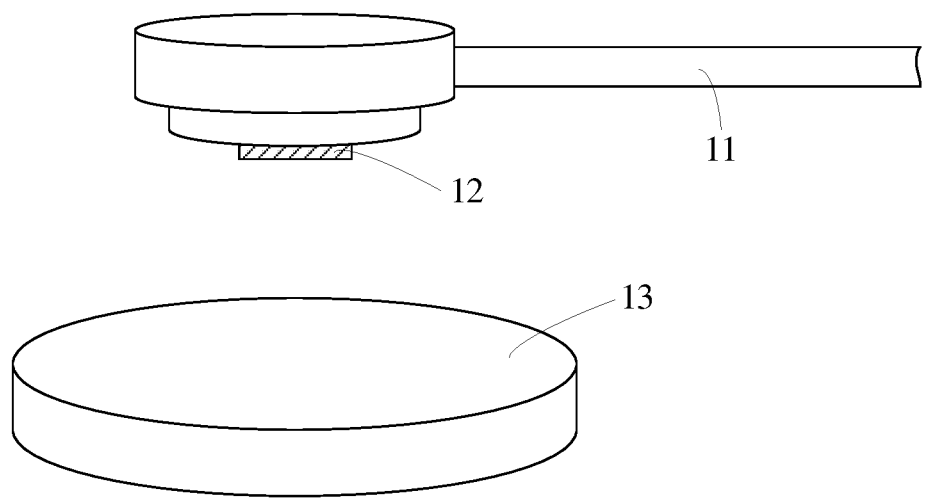
FIG. 1 is a schematic structural diagram of a force measurement system.

FIG. 1 is a schematic structural diagram of a force measurement system.

Referring to FIG. 1, a load cell 12 is installed on a grinding arm 11. After a downforce is set on a machine, the grinding arm 11 drives the load cell 12 to act on a stressed device 13, and the stressed device 13 makes a feedback to the load cell 12 by way of a counterforce, so that the load cell 12 obtains the current force of the grinding arm 11.

In a prior art, before the load cell 12 is installed, a grinding disk required in an actual grinding process and installed on the grinding arm 11 needs to be removed first, and then the load cell 12 is installed on the grinding arm 11 by means of magnetic attraction or the like. In this way, the force acquired by the load cell 12 only includes a pressure stress set by the machine and applied by the grinding arm 11, but does not include a self-weight of the grinding disk. Therefore, the force acquired by the load cell 12 is not a force acting on a grinding object during the actual grinding process, and accordingly, the machine cannot accurately monitor and calibrate the force acting on the grinding object during the actual grinding process, according to a value obtained by the load cell 12.

Moreover, in order to ensure the effective transmission of data of the load cell 12, a signal line of the load cell 12 needs to be connected to an analysis device. Since the load cell 12 is fixed on the grinding arm 11 and the grinding arm 11 needs to move up and down during the actual grinding step, the signal line will move up and down with the grinding arm 11, and the up and down movement may cause internal damage, poor contact or other problems to the signal line, which further will cause deviations in the detection data due to the internal damage and the poor contact.

In addition, the current load cell 12 usually only records a maximum counterforce fed back by the stressed device 13 as the force applied by the grinding arm 11, rather than showing the distribution of the force applied by the grinding arm 11 to the stressed device 13. In extreme cases, there may be a certain inclination angle between the grinding disk and a grinding disk of the grinding object. In this case, a predetermined grinding result cannot be obtained even if the sum of the force provided by the grinding arm 11 and a self-weight of the grinding disk is equal to a predetermined grinding force.

To solve the above problem, an embodiment of the present disclosure provides a force measurement system. A plurality of elastic bodies are arranged between the stressed layer and the base, and forces applied by the grinding arm to different positions on the stressed layer are measured by the plurality of elastic bodies; in this way, the balance of the force applied by the grinding arm can be further represented according to the forces at different positions on the stressed layer.

In order to make the objectives, technical solutions, and advantages of the embodiments of the present disclosure more clear, various embodiments of the present disclosures will be detailed below in combination with the accompanying drawings. However, a person of ordinary skill in the art can understand that in each embodiment of the present disclosure, many technical details are provided for readers to better understand the present disclosure. However, even if these technical details are not provided and based on variations and modifications of the following embodiments, the technical solutions sought for protection in the present disclosure can also be implemented.

Figure 2:
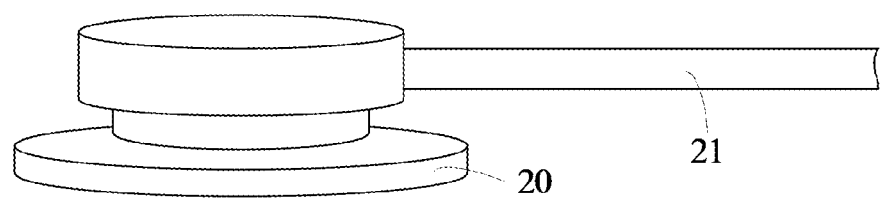
FIG. 2 is a schematic structural diagram of a force measurement system according to an embodiment of the present disclosure.
Figure 2:
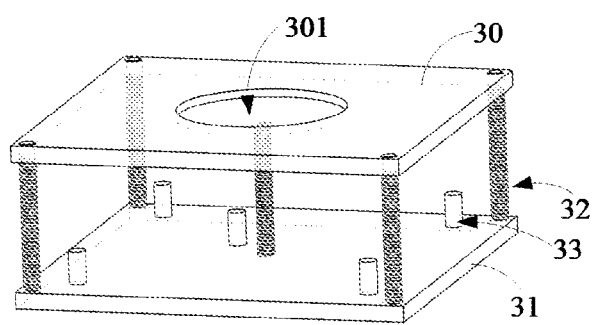

FIG. 2 is a schematic structural diagram of a force measurement system according to an embodiment of the present disclosure.

Referring to FIG. 2, the force measurement system includes: a grinding arm 21 and a stressed layer 30, the stressed layer 30 being configured to bear a force applied to the grinding arm 21; a base 31 and a plurality of elastic bodies 32, the plurality of elastic bodies 32 being fixed between the stressed layer 30 and the base 31; a deformation sensor 33 configured to detect deformation of the elastic bodies 32; and an analysis device (not shown) configured to obtain a force acting on the stressed layer 30 according to a detection result of the deformation sensor 33 and an elastic coefficient of the elastic bodies 32.

In this embodiment, the force measurement system further includes a grinding disk 20 fixed on the grinding arm 21, and the grinding arm 21 applies a force to the stressed layer 30 through the grinding disk 20. Since the elastic bodies 32 are installed between the stressed layer 30 and the base 31, the grinding disk 20 can be installed on the grinding arm 21. The grinding arm 21 can drive the grinding disk 20 to apply a force to the stressed layer 30 together, and the elastic bodies 32 can measure the sum of the force applied by the grinding arm 21 and the self-weight of the grinding disk 20. In this way, the measurement result of the elastic bodies 32 are closer to a force on the grinding object during the actual grinding process, thus ensuring that the grinding object has a better grinding result during the actual grinding process.

In this embodiment, a signal line of the deformation sensor 33 is fixed by the base 31. Since the base 31 does not move during the grinding process, fixing the signal line by the base 31 can favorably ensure that the signal line has good stability and excellent performance, thereby ensuring that the deformation sensor 33 can accurately obtain the deformation of the elastic bodies 32, and moreover ensuring that the analysis device can accurately obtain the sum of the force applied by the grinding arm 21 and the self-weight of the grinding disk 20 according to the deformation of the elastic bodies 32.

In this embodiment, the actual designation of the stressed layer varies according to application scenarios. Specifically, in the actual polishing process, the stressed layer 30 is generally configured as a polishing pad, and the polishing object is generally configured as a wafer; in a test process of the force measurement system, the stressed layer 30 can also serve as a stressed surface of a test structure; that is, the test structure is used to simulate a polishing pad to ensure the accuracy of parameters of the force measurement system used in the actual grinding process.

Hereinafter, a description is provided by an example where the stressed layer 30 serves as a stressed surface of the test structure. Details are specified as follows:

In this embodiment, the number of elastic bodies 32 is greater than or equal to three, for example four. A larger number of elastic bodies 32 can detect forces at more positions on the surface of the stressed layer 30. Since at least three points can define a plane, the number of elastic bodies 32 needs to be greater than or equal to three, and then the analysis device can calculate a stress condition on the entire surface of the stressed layer 30 to represent a stress condition on the stressed surface of the grinding object during the actual grinding process, and to determine the stress balance of the grinding object.

When the number of elastic bodies 32 is less than three, the analysis device can only obtain a stress condition on a straight path or in a local point-shaped region on the surface of the stressed layer 30; in addition, the stress balance of the grinding object can be represented by a maximum force difference between different positions on the surface of the stressed layer 30 or by parameters such as the variance of force on the stressed surface.

When the number of elastic bodies 32 is three, the elastic bodies 32 can be distributed in a triangular shape to better support the stressed layer 30; in this embodiment, the number of elastic bodies 32 is four or more, and the four elastic bodies 32 define a rectangle to stably support the stressed layer 30.

In this embodiment, the stressed layer 30 has a center of stress. In a direction parallel to a top surface of the stressed layer 30, there are at least two of the elastic bodies 32 having the same distance from the center of stress. The center of stress refers to the center of the stressed surface of the stressed layer 30. Ideally, stresses at any two positions on the stressed surface are equal; and when the force of the grinding arm 21 is mainly concentrated on the center of stress, stresses at different positions on the stressed surface should follow the principle of equal distance and equal stress, that is, the stresses at different positions having equal distance from the center of stress are the same. Therefore, the stress balance of the stressed layer 30 can be obtained by comparing the deformations of the elastic bodies 32 at different positions with the same distance from the center of stress.

At least the following two cases may lead to a poor stress balance of the stressed layer 30. Case 1: when applying a force to the stressed layer 30, the grinding arm 21 shifts, resulting in that the center of the actual stressed surface of the stressed layer 30 is not a predetermined center of stress. Case 2: there is a certain inclination angle between the grinding disk 20 and the stressed layer 30, resulting in that the forces applied by the grinding arm 21 and by the grinding disk 20 to the stressed layer 30 are concentrated on one side of the center of stress.

When the balance of force on the stressed layer 30 does not meet the predetermined requirements, it can be considered that in the actual grinding process, the stress balance of the grinding object may not meet the predetermined requirements, so the machine, the grinding arm 21 or the grinding disk 20 need to be calibrated according to parameters fed back by the deformation sensor 33.

In this embodiment, a groove 301 is formed in the stressed layer 30. The groove 301 is configured to receive a calibration weight. A center of the groove 301 serves as the center of stress, so as to prevent a case where the center of gravity of the stressed layer 30 shifts due to the arrangement of the groove 301. When the stressed layer 30 is under a force, a calibration weight of any weight can be placed anywhere in the groove 301 to control the stressed layer 30 to have a good stress balance, and to cause the stressed layer 30 to bear a predetermined force. Thus, the force and position of the grinding arm 21 and the weight and angle of the grinding disk 20 can be calibrated according to the position and weight of the calibration weight, so that the sum of the force set on the machine and the self-weight of the grinding disk 20 is equal to a grinding force required for the grinding object; in this way, a case where the actual force is greater than or less than the required grinding force can be avoided, and the stressed layer 30 can achieve a relatively high force balance.

In addition, it can be seen from the above that the balance of the force on the stressed layer 30 is also reflected in whether stresses at different positions having different distances from the center of stress are equal. When the stresses are not equal, it can be considered that the grinding disk 20 and the surface of the stressed layer 30 are not in good fit, resulting in that no stress exists in a partial surface of the stressed layer 30.

In this embodiment, in a direction perpendicular to the surface of the stressed layer 30, orthographic projections of the elastic bodies 32 are entirely coincident with an orthographic projection of the grinding disk 20. In this way, when performing stress calculation, the analysis device has a larger number of data anchor points that can reflect the true stress condition, which is beneficial to more accurately calculating the stress condition in other regions of the stressed surface.

In this embodiment, a diameter of the groove 301 is less than a diameter of the grinding disk 20, and the groove 301 is only configured to receive the calibration weight; in other embodiments, the diameter of the groove is greater than the diameter of the grinding disk, the grinding disk and the calibration weight can be put into the groove together, and in the direction perpendicular to the surface of the stressed layer, the orthographic projections of at least part of the elastic bodies are outside the orthographic projection of the grinding disk. The calibration weight can be either a standard weight or a weight customized according to actual needs.

In this embodiment, a center axis of one of the elastic bodies 32 passes through the center of stress, that is, the elastic bodies 32 are also located between the center of stress and the base 31.

When the analysis device calculates the stress condition on the stressed layer 30, the stress condition at the center of stress can be further obtained, and the stress condition between the center of stress and an edge of stress can be calculated more effectively to improve the accuracy of the calculation result.

In this embodiment, the analysis device is further configured to calibrate the plane position and orientation of the grinding arm 21 according to difference of deformation between the elastic bodies 32. By calibrating the plane position of the grinding arm 21, it can be ensured that in the direction perpendicular to the surface of the stressed layer 30, the center of a surface, facing the stressed layer 30, of the grinding disk 20 is in the same axis as the predetermined center of stress; by calibrating the orientation of the grinding arm 21, it can be ensured that the grinding disk 20 and the surface of the stressed layer 30 are in good fit, and a case where an inclination angle between the grinding disk 20 and the surface of the stressed layer 30 goes beyond an allowable error range can be avoided, thus ensuring that the actual stressed surface of the stressed layer 30 has a good stress balance.

In this embodiment, the plurality of elastic bodies 32 are of the same specification; specifically the plurality of elastic bodies 32 are the same in length and elastic coefficient. In this way, it is beneficial to ensuring that under the same force, different elastic bodies 32 have the same deformation and the same rebound force, so as to ensure that the grinding disk 20 can grind different regions of the grinding object to the same degree, thus avoiding difference in wear caused by different pressing forces.

The elastic bodies 32 may be configured as a spring with a maximum elastic force of 15N, the deformation sensor 33 may be configured as a laser sensor, and the maximum elastic force of the elastic bodies 32 may be calibrated according to the requirements of the grinding object and the specific grinding process.

In this embodiment, before the grinding arm 21 applies a force to the stressed layer 30, a measurement value of the deformation sensor 33 needs to be calibrated to zero, thereby avoiding an adverse effect of the self-weight of the stressed layer 30 on the detection result.

In this embodiment, a plurality of elastic bodies are arranged between the stressed layer and the base, and forces applied by the grinding arm to different positions on the stressed layer are measured by the plurality of elastic bodies; moreover, the balance of force applied by the grinding arm can be further represented according to the forces at different positions on the stressed layer.

The ordinary skills in the art can understand that the implementations described above are particular embodiments for implementing the present application. In practical uses, various changes in forms and details may be made to the implementations without departing from the spirit and scope of the present application. Any person skilled in the art may make their own changes and modifications without departing from the spirit and scope of the present disclosure. Therefore, the protection scope of the present disclosure shall be subject to the protection scope of the claims.

What is claimed is:

1. A force measurement system, comprising:
    a grinding arm and a stressed layer, the stressed layer being configured to bear a force from the grinding arm;
    a base and a plurality of elastic bodies, the elastic bodies being fixed between the stressed layer and the base;
    a deformation sensor, configured to detect deformation of the elastic bodies; and
    an analysis device, configured to measure the force on the stressed layer according to a detection result of the deformation sensor and an elastic constant of the elastic bodies;
    wherein the stressed layer has a center of stress; and in a direction parallel to a top surface of the stressed layer, there are at least two of the elastic bodies having a same distance from the center of stress; and
    a groove is formed in the stressed layer, the groove being configured to receive a calibration weight, and a center of the groove serves as the center of stress.

2. The force measurement system according to claim 1, further comprising: a grinding disk, fixed on the grinding arm, the grinding arm applies the force to the stressed layer through the grinding disk.

3. The force measurement system according to claim 1, wherein the stressed layer comprises a grinding pad.

4. The force measurement system according to claim 1, wherein a number of the elastic bodies is greater than or equal to three.

5. The force measurement system according to claim 1, wherein a center axis of one of the elastic bodies passes through the center of stress.

6. The force measurement system according to claim 1, wherein the analysis device is further configured to calibrate a plane position and orientation of the grinding arm, according to a difference of deformation between the elastic bodies.

7. The force measurement system according to claim 1, wherein in a direction perpendicular to a surface of the stressed layer, orthographic projections of the elastic bodies are entirely coincident with an orthographic projection of a grinding disk.

8. The force measurement system according to claim 1, wherein the elastic bodies have a same specification.

9. A force measurement system, comprising:
   a grinding arm and a stressed layer, the stressed layer being configured to bear a force from the grinding arm;
   a base and a plurality of elastic bodies, the elastic bodies being fixed between the stressed layer and the base;
   a deformation sensor, configured to detect deformation of the elastic bodies; and
   an analysis device, configured to measure the force on the stressed layer according to a detection result of the deformation sensor and an elastic constant of the elastic bodies;
   wherein the stressed layer has a center of stress; and in a direction parallel to a top surface of the stressed layer, there are at least two of the elastic bodies having a same distance from the center of stress; and
   a center axis of one of the elastic bodies passes through the center of stress.

10. The force measurement system according to claim 9, further comprising: a grinding disk, fixed on the grinding arm, the grinding arm applies the force to the stressed layer through the grinding disk.

11. The force measurement system according to claim 9, wherein the stressed layer comprises a grinding pad.

12. The force measurement system according to claim 9, wherein a number of the elastic bodies is greater than or equal to three.

13. The force measurement system according to claim 9, wherein the analysis device is further configured to calibrate a plane position and orientation of the grinding arm, according to a difference of deformation between the elastic bodies.

14. The force measurement system according to claim 9, wherein in a direction perpendicular to a surface of the stressed layer, orthographic projections of the elastic bodies are entirely coincident with an orthographic projection of a grinding disk.

15. The force measurement system according to claim 9, wherein the elastic bodies have a same specification.

16. A force measurement system, comprising:
   a grinding arm and a stressed layer, the stressed layer being configured to bear a force from the grinding arm;
   a base and a plurality of elastic bodies, the elastic bodies being fixed between the stressed layer and the base;
   a deformation sensor, configured to detect deformation of the elastic bodies; and
   an analysis device, configured to measure the force on the stressed layer according to a detection result of the deformation sensor and an elastic constant of the elastic bodies, and further configured to calibrate a plane position and orientation of the grinding arm, according to a difference of deformation between the elastic bodies;
   wherein the stressed layer has a center of stress; and in a direction parallel to a top surface of the stressed layer, there are at least two of the elastic bodies having a same distance from the center of stress.

17. The force measurement system according to claim 16, further comprising: a grinding disk, fixed on the grinding arm, the grinding arm applies the force to the stressed layer through the grinding disk.

18. The force measurement system according to claim 16, wherein the stressed layer comprises a grinding pad.

19. The force measurement system according to claim 16, wherein a number of the elastic bodies is greater than or equal to three.

20. The force measurement system according to claim 16, wherein in a direction perpendicular to a surface of the stressed layer, orthographic projections of the elastic bodies are entirely coincident with an orthographic projection of a grinding disk.

* * * * *